United States Patent
Kundu

(10) Patent No.: US 7,312,676 B2
(45) Date of Patent: Dec. 25, 2007

(54) MULTILAYER BAND PASS FILTER

(75) Inventor: Arun Chandra Kundu, Phoenix, AZ (US)

(73) Assignee: TDK Corporation, Tokyo (JP)

( * ) Notice: Subject to any disclaimer, the term of this patent is extended or adjusted under 35 U.S.C. 154(b) by 110 days.

(21) Appl. No.: 11/173,674

(22) Filed: Jul. 1, 2005

(65) Prior Publication Data

US 2007/0001786 A1 Jan. 4, 2007

(51) Int. Cl.
*H01P 1/203* (2006.01)

(52) U.S. Cl. ...................................... 333/204; 333/205

(58) Field of Classification Search ......... 333/202–206
See application file for complete search history.

(56) References Cited

U.S. PATENT DOCUMENTS

| | | | | |
|---|---|---|---|---|
| 5,066,933 A | * | 11/1991 | Komeda | 333/204 |
| 5,608,364 A | * | 3/1997 | Hirai et al. | 333/204 |
| 5,719,539 A | | 2/1998 | Ishizaki et al. | |
| 6,020,799 A | | 2/2000 | Ishizaki et al. | |
| 6,304,156 B1 | | 10/2001 | Ishizaki et al. | |
| 6,414,567 B2 | | 7/2002 | Matsumura et al. | |
| 6,424,236 B1 | | 7/2002 | Kato | |
| 6,720,849 B2 | * | 4/2004 | Sasaki et al. | 333/204 |
| 6,822,534 B2 | | 11/2004 | Uriu et al. | |
| 6,965,285 B2 | | 11/2005 | Hirabayashi | |
| 2006/0087387 A1 | * | 4/2006 | Kubota et al. | 333/204 |

OTHER PUBLICATIONS

"Equivalent Circuit Representation and Explanation of Attenuation Pole of a Dual-Mode Dielectric Resonator Bandpass Filter" Awai, I. and Kundu, A.C.; IEEE Trans. Microwave Theory and Tech. vol. MTT-46, Dec. 1998.

* cited by examiner

*Primary Examiner*—Seungsook Ham
(74) *Attorney, Agent, or Firm*—Allen J. Moss; Alex Starkovich; Squire, Sanders & Demspey LLP

(57) ABSTRACT

A filter comprises a band pass filter that may have a first resonator, a second resonator and a coupling between the first resonator and the second resonator. The coupling may be controlled by at least one of (i) a spacing between the first resonator and the second resonator, and (ii) a shunt inductance coupled to the coupling.

10 Claims, 13 Drawing Sheets

Fig. 1 *(PRIOR ART)*

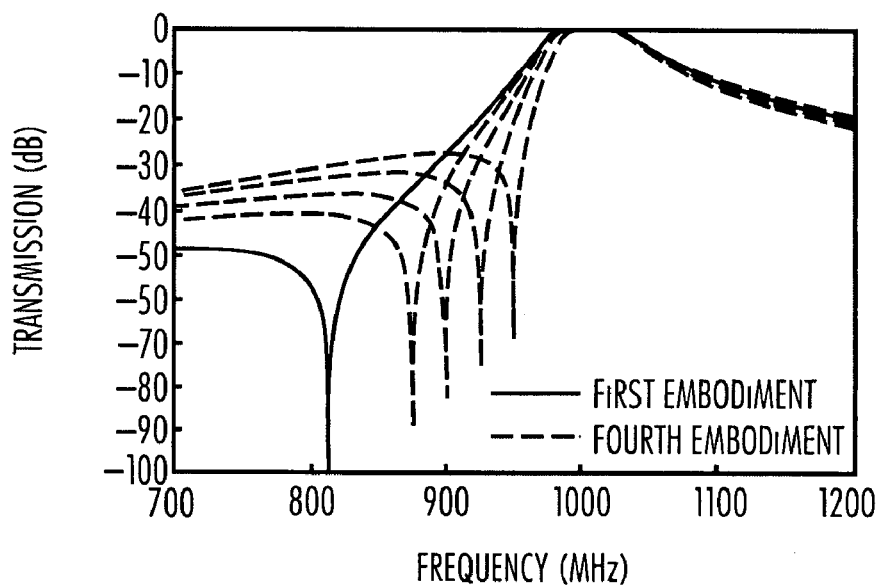
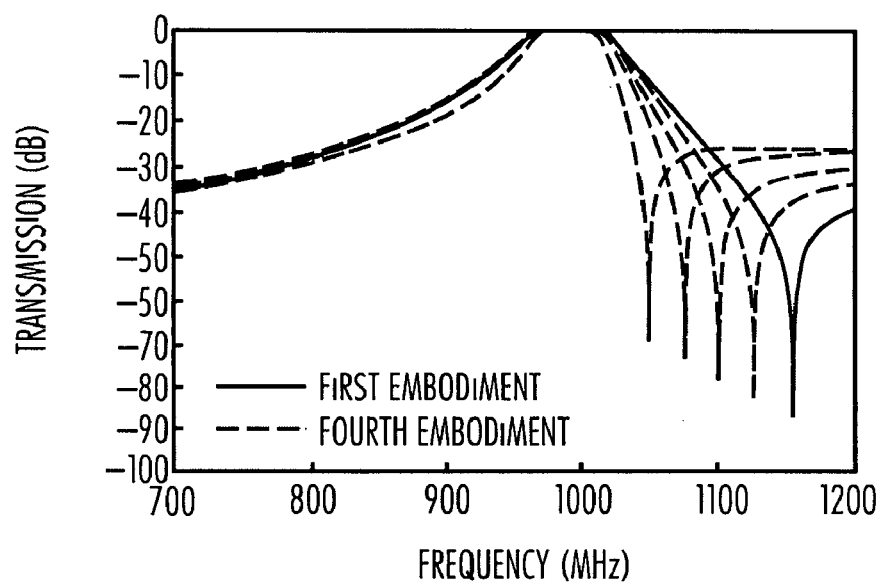
Fig. 3 *(PRIOR ART)*

MULTILAYER BAND PASS FILTER

FIELD OF THE INVENTION

Embodiments of the present invention relate to filters, and more particularly to multilayer band pass filters that may be used in an electrical system, such as a duplexer or diplexer.

BACKGROUND OF THE INVENTION

In recent years, marked advances in miniaturization of mobile communication devices, such as mobile phones and Wireless LAN (Local Area Network) devices, have been achieved, thanks to miniaturization of the various components incorporated therein. One of the components incorporated in a communications device is a band pass filter. A band pass filter suppresses signals having frequencies outside a particular bandwidth, and passes signals having frequencies within the particular bandwidth, with little or no suppression. Band pass filters are widely used. For example, band pass filters may be found in duplexers and diplexers associated with cellular telephones. Band pass filters may also allow an antenna of a cellular phone to transmit at one band of frequencies while receiving at another band of frequencies.

One type of band pass filter is described in U.S. Pat. No. 6,020,799, FIG. 12 of which is reproduced as FIG. 1 herein. Referring to FIG. 1, a band pass filter is comprised of two TEM (Transverse Electromagnetic Mode) resonators. The resonators are connected together in a cascade connection. Each resonator includes a pair of transmission lines including a narrow transmission line of high impedance and a wider transmission line of lower impedance. The narrow transmission line of each resonator may be regarded as a proximal end of the corresponding resonator. The proximal end of each resonator is connected to the proximal end of the other resonator, and is also grounded. The wider transmission line of each resonator, having a lower impedance than either of the narrow transmission lines, may be regarded as a distal end of the corresponding resonator. The distal end of each resonator is "open" in that no direct electric current may flow therethrough. The narrow transmission line of each resonator is coupled electromagnetically to the narrow transmission line of the other resonator, and the wider transmission line of each resonator is coupled electromagnetically to the wider transmission line of the other resonator. Electromagnetic fields generated in each resonator interfere and couple with electromagnetic fields generated in the other resonator, creating what may be described as a "coupling" or an "electromagnetic coupling" between the resonators.

In U.S. Pat. No. 6,020,799, however, the distal end of each TEM mode resonator is capacitively coupled to input and output terminals and to ground. The overall structure provides a substantial amount of capacitive coupling. An inter-stage coupling capacitor is also added to control the coupling as well as the attenuation pole frequency, but throughout the structure, the reactive coupling is entirely capacitive. Since the coupling is entirely capacitive, only limited control is available to place attenuation poles with precision. To mitigate this capacitive reactive coupling, the line distance between the resonators can be reduced, and the attenuation pole frequency of the transmission characteristics can also be adjusted by varying the line distance of the first transmission lines and the line distance of the second transmission lines. But these approaches to mitigating the excessive capacitance of the reactive coupling can only go so far, since photolithographic techniques cannot place the lines more closely together than the photolithographic limit, generally 0.2 mm today. Also, by adjusting the even and odd mode impedance ratio of the transmission line by the distance between lines, the degree of coupling can be changed. Nevertheless, the line distance between the resonators can only be reduced so far.

SUMMARY OF THE INVENTION

In accordance with a first aspect of the present invention, a band pass filter can comprise a first resonator and a second resonator. A coupling between the first resonator and the second resonator can be controlled by at least one of (i) a spacing between the first resonator and the second resonator, and (ii) a shunt inductance coupled to the coupling.

In accordance with a second aspect of the present invention, a filter can comprise filtering means for passing a band of frequencies. The filtering means can have first resonator means and second resonator means. The filter can also include coupling means between the first resonator means and the second resonator means. The coupling means can be controlled by at least one of (i) a spacing between the first resonator means and the second resonator means, and (ii) shunt inductance means coupled to the coupling means.

BRIEF DESCRIPTION OF THE DRAWINGS

FIG. 3 shows two graphs of transmission characteristic simulation results for improving the attenuation amount near the passing band of the dielectric filter, in accordance with the well-known structure described in FIG. 1 and FIG. 2.

DETAILED DESCRIPTION OF THE EXEMPLARY EMBODIMENTS

A need exists for a communication device that may include more than one passive component that may be integrated in a single multilayer body. By adjusting the reactance of passive components, such as capacitors and inductors within a band pass filter ("BPF"), the attenuation poles of the BPF can be more precisely and easily positioned. The single multilayer body may have several terminals that may be connected through one or more vias, and may not require big terminating electrodes. Some of the via inductances may be sensitive to BPF electrical performance, which may be taken into consideration.

Figure 1:
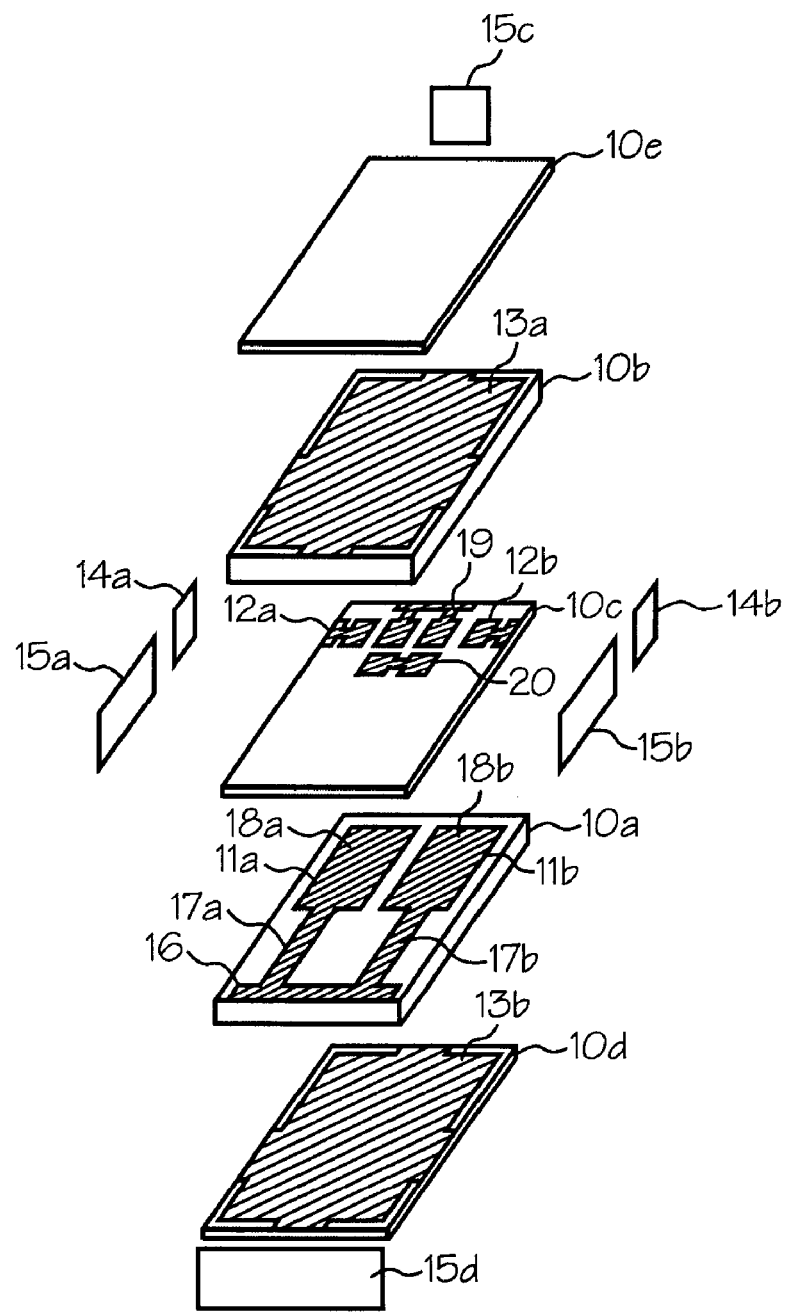
FIG. 1 is a perspective exploded view of a well-known laminated dielectric band pass filter ("BPF") structure, in accordance with a well-known implementation that is described in U.S. Pat. No. 6,020,799.

FIG. 1 is a perspective exploded view of a laminated dielectric BPF structure, in accordance with a well-known implementation that is described in U.S. Pat. No. 6,020,799. The laminated dielectric BPF structure has an even mode impedance Ze that can be realized in the range of 7Ω to 35Ω. Due to photolithograph limitations, lines cannot generally be implemented with a line width or a gap narrower than 0.2 mm, nor greater than 2 mm. Therefore, the minimum even mode impedance step ratio Ke is 0.2 between the transmission lines of each resonator. Moreover, if Ke is large, the resonator length cannot be shortened, and hence there is a proper range for Ke, and in relation to the structural parameter of the strip line, it is preferably 0.2 to 0.8, and more preferably 0.4 to 0.6. Hence, the even/odd mode impedance ratio P that can be realized is approximately 1.4 or less when the even mode impedance is 7 Ω, 1.9 or less at 20 Ω, and 2.2 or less at 35 Ω.

The laminated dielectric BPF structure of FIG. 1 has a plurality of thick dielectric sheets 10a-e on which devices are implemented. Dielectric sheet 10a contains a pair of strip line resonators implemented as transmission lines 17a and 17b. The first transmission line 17a has a strip line resonator electrode 11a and the second transmission line 17b has a strip line resonator electrode 11b. The first transmission line 17a and the second transmission line 17b share a common grounding electrode 16. The first transmission lines 17a and 17b have high characteristic impedance and are grounded at one end, and second transmission lines 18a and 18b have low characteristic impedance and are open at one end. A coupling capacity (Cc) 28 (shown in FIG. 2) is formed between coupling capacity electrode 20 and strip line resonator electrodes 11a and 11b. Loading capacities ($C_L$) 26 and 27 (shown in FIG. 2) are formed between the loading capacity electrode 19 and strip line resonator electrodes 11a and 11b, which are added. The laminated electric BPF is thus implemented between the strip line resonator electrodes 11a and 11b.

The laminated BPF structure has two TEM mode resonators in the resonator structure with an overall line length shorter than a quarter wavelength. The first transmission lines (i.e. the narrow transmission lines having relatively high impedance) are cascade connected with respective second transmission lines (i.e., the wide transmission lines having lower impedance). The characteristic impedance of the second transmission lines is lower than that of the first transmission lines. Each of the first transmission lines is grounded at a proximal end, and each of the second transmission lines is open at a distal end. The first transmission lines are coupled electromagnetically, and the second transmission lines are coupled electromagnetically. The amount of electromagnetic coupling in both cases is set independently.

Dielectric sheet 10c contains a loading capacity electrode 19 that forms loading capacities ($C_L$) 26, 27 (shown in FIG. 2) with strip line resonator electrodes 11a and 11b, respectively. Dielectric sheet 10c also contains a capacity electrode 12a that forms a first capacitor with the strip line resonator electrode 11a, and a capacity electrode 12b that forms a second capacitor with the strip line resonator electrode 11b. Dielectric sheet 10b contains input and output terminals 14a and 14b, respectively, and grounding terminals 15a and 15b.

The combination of the coupling capacity (Cc) 28 (shown in FIG. 2) and loading capacities ($C_L$) 26 and 27 (shown in FIG. 2) allows adjustment of the even/odd mode impedance ratio ($P_1$, $P_2$). Hence, an attenuation pole is set in the vicinity of the passing band. Dielectric sheet 10b and dielectric sheet 10d are covered with shield electrodes 13a and 13b, respectively. The resonator ends 16, loading capacitor end 19 and I/O terminals 12a and 12b are side terminated with large electrodes 15d, 15c, 14a and 14b, respectively. The inductance effect of such electrodes is negligible due to the relative large area of the electrodes.

Two TEM mode resonators are capacitively coupled through separate coupling means, so that an attenuation pole can be generated near the pass band of the filter. The loading capacities ($C_L$) 26 and 27 (shown in FIG. 2) are parallel to the strip line resonator electrodes 11a and 11b.

Figure 2:
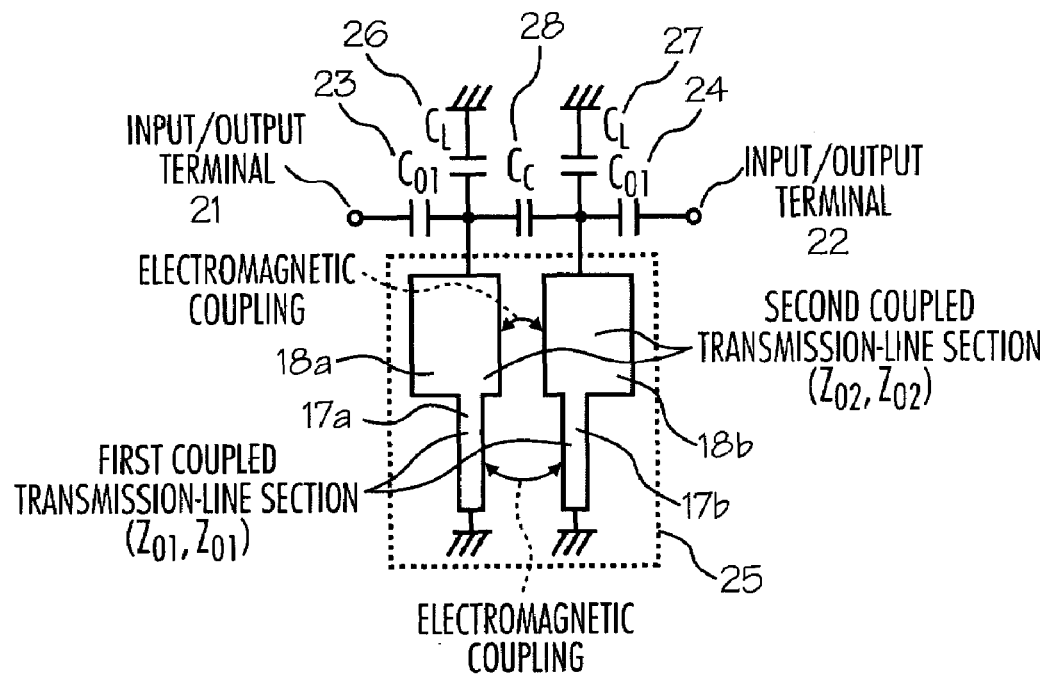
FIG. 2 is an equivalent circuit for the dielectric BPF structure of FIG. 1.

By setting the relation of P1 and P2, the attenuation pole can be freely formed at a specified frequency. However, the open end of the TEM mode resonator is grounded with a shunt loading capacitor. The TEM mode resonator and the input and output terminals are coupled capacitively. The attenuation pole frequency of the transmission characteristics is adjusted by varying the line distance of the first transmission lines and the line distance of the second transmission lines. By adjusting the even and odd mode impedance ratio of the transmission lines by setting the distance between lines, the degree of coupling can be changed. As shown in FIG. 2, inter-stage coupling capacitor (Cc) 28 is added to control the coupling, as well as the attenuation pole frequency.

One problem with this design, however, is that although the attenuation pole can be generated near the pass band, it cannot provide multiple attenuation poles on both sides of the pass band. A filter having attenuation poles on both side of the pass band can increase the attenuation of the out-of-band frequencies simultaneously, which may be desired for many filter applications.

Also, in the prior art design of FIG. 1, it is difficult to realize an attenuation pole at the desired frequency for a desired filter center frequency and desired resonator coupling, i.e., for a desired filter bandwidth of 3 dB down on either side of the center frequency, since the attenuation pole becomes a complicated function of transmission line impedance, the loading capacitor and the internal coupling capacitor. Since the input and output coupling capacitors (capacitors 23 and 24, as shown in FIG. 2, and located in FIG. 1 between the strip line resonator electrodes 11a and 11b and the capacity electrodes 12a and 12b, respectively), inter-stage coupling capacity (Cc) 28, as shown in FIG. 2, and loading capacities ($C_L$) 26 and 27, as shown in FIG. 2, are all on the same layer, it is difficult to design a wideband filter, which requires large input and output coupling capacitors 23 and 24. Moreover, since the input and output coupling capacitors 23 and 24, inter-stage coupling capacity (Cc) 28, and loading capacities ($C_L$) 26 and 27 are all on the same layer, it is difficult to design a miniaturized BPF, at least with respect to an x-y dimensional plane. For at least these reasons, a stripline resonator BPF, as shown in FIG. 1, is not suitable for filters which require a wide band, i.e., a large bandwidth.

Another problem with the BPF structure of FIG. 1 is the size and location of the terminating electrodes. Miniaturization of communication devices may require that more than one passive component be integrated in a single multilayer body. A better approach would have terminals of individual components connected through one or more vias, enabling the terminals to be located on the bottom of the device, for example, instead of having large side-terminating terminals. If vias are used in such an improvement, some of the via inductances may be sensitive to BPF electrical performance, and may therefore have to be taken into consideration.

FIG. 2 is an equivalent circuit for the dielectric BPF structure of FIG. 1. As shown in FIG. 2, the large input and output coupling capacitors 23 and 24 have input/output terminals 21 and 22, respectively.

FIG. 3 shows two graphs of transmission characteristic simulation results for the dielectric BPF structure described in FIG. 1 and FIG. 2. The top graph of FIG. 3 relates to a filter with a low-zero attenuation pole, and the bottom graph relates to a filter with a high-zero attenuation pole. In both cases, the solid line shows the characteristic when the attenuation pole is farthest from the passing band in the filter.

Figure 4:
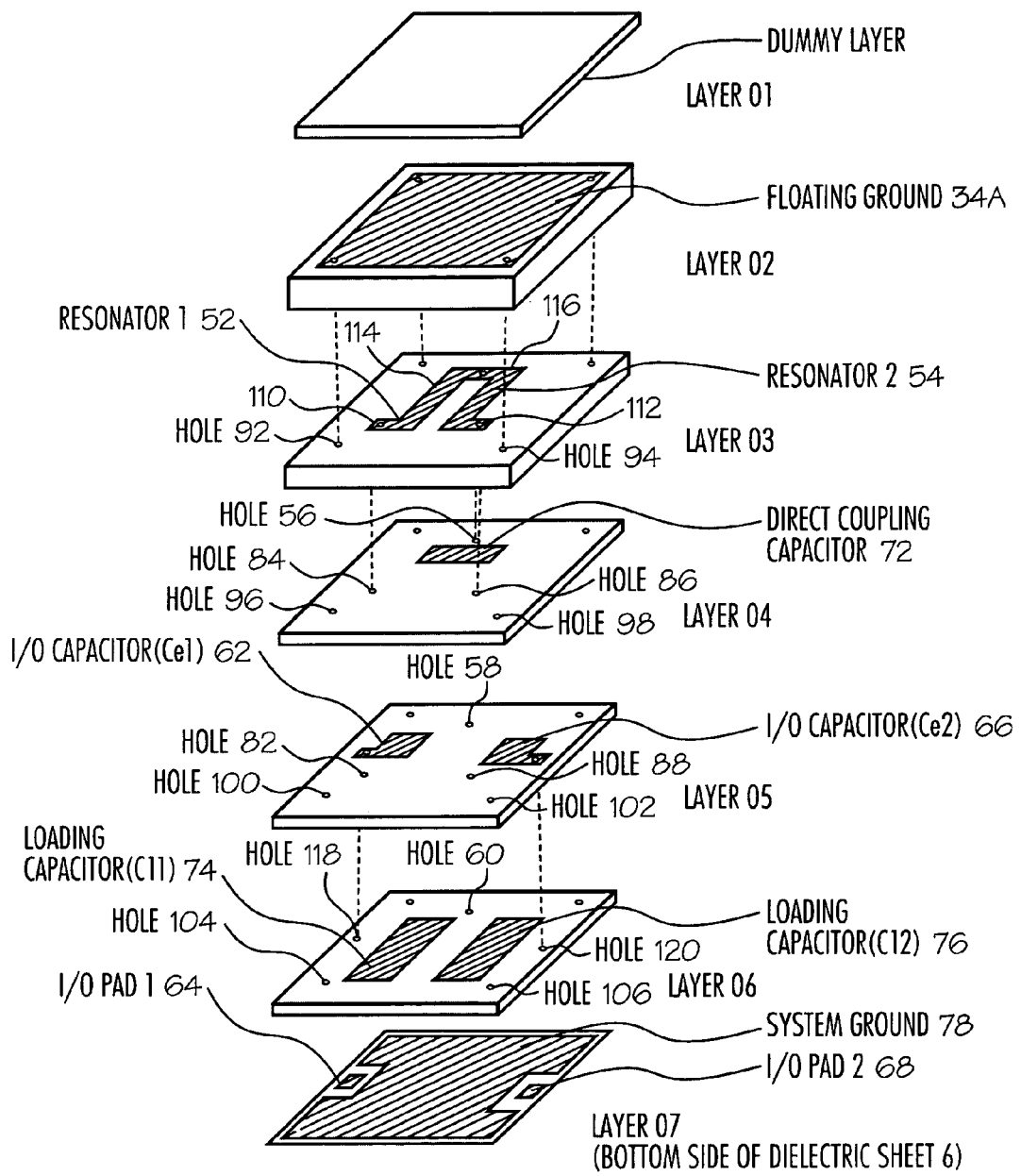
FIG. 4 is a perspective exploded view of a band pass filter configuration, in accordance with a first embodiment of the present invention.
Figure 5:
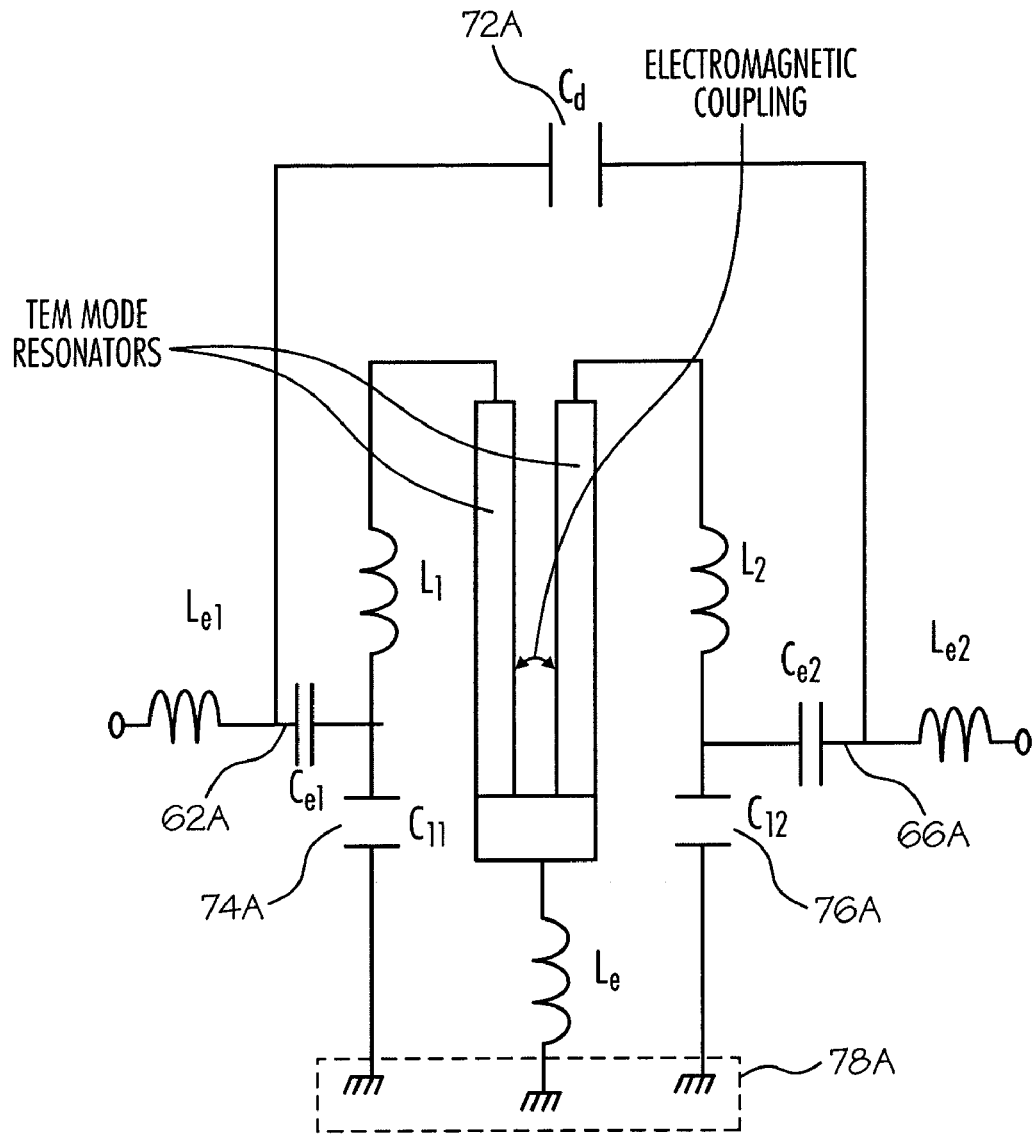
FIG. 5 is an equivalent circuit for the band pass filter configuration of FIG. 4.

FIG. 4 is a perspective exploded view of a BPF configuration, in accordance with a first embodiment of the present invention. FIG. 5 is an equivalent circuit for the band pass filter configuration of FIG. 4.

Referring to FIG. 4, two quarter-wave planar TEM mode stripline resonators 52 and 54 may be placed side by side. One end of the resonators may be connected together and connected to the system ground through the inductance of a via inductor which may be implemented from the short end 116 to ground through a hole in layer 03 and through holes 56-60. The electromagnetic coupling between resonators 52 and 54 may depend upon the spacing between resonators 52 and 54 and the value of shunt inductance of the via inductor. For this type of structure, the dominant coupling between the resonators 52 and 54 may become inductive due to the relatively large inductance of the via inductor that may be implemented from the short end 116 through a hole in layer 03 and through holes 56-60. Input/Output port capacitance between I/O ports may be formed with I/O capacitors, which may be implemented between plate 62 and 74 and between plates 66 and 76. The direct coupling capacitance ($C_d$) and inductive internal coupling between resonators 52 and 54 may provide attenuation poles at both sides of the BPF's pass band. The position of these attenuation poles can be controlled by changing the value of direct coupling capacitance ($C_d$), which may be implemented between plate 72 and I/O electrodes 62 and 66. The direct coupling capacitance ($C_d$) may have no effect upon internal coupling.

The shunt loading capacitors C11 and C12, which may be implemented between plates 74 and 76, respectively, and ground plate 78, may be placed on a separate dielectric sheet and capacitances may be formed with the system ground 78 of the BPF. The shunt loading capacitors C11 and C12 formed by plates 74 and 76, respectively, and ground 78 may be connected to the resonators' open end through via inductances, which may be implemented through holes 82-88 and continuing through holes in layer 03 to the distal ends 110 and 112. The loading capacitors C11 and C12 may help reduce the resonator length for a desired center frequency. The resonator length may determine equivalent capacitance and inductance of the resonator. Each resonator may be understood as being equivalent to a capacitance in parallel with an inductance, which may be in series with $L_e$. The series connection of L1 and C11 is essentially in parallel with the resonator, and the overall resonant frequencies of the resonator may be influenced by each of these passive components. The resonant frequency may be computed by the equation $1/(2\pi\sqrt{(LC)})$, where L and C represent the overall inductance and capacitance of a resonator environment that includes L1, the shunt loading capacitor C11, Le, and an internal inductance and capacitance of the resonator as determined by the resonator geometry including its length. Hence, the optimum loading capacitance may be designed to miniaturize the BPF size.

For a wideband BPF, the I/O coupling capacitors formed between plates 62 and 74 and between plates 66 and 76 may be suitably large. The I/O coupling capacitors (plates 62 and 74 and plates 66 and 76) are shown on independent dielectric sheets and may be capacitively coupled with the shunt loading capacitors (plates 74 and 76, and ground 78), where it may be possible to design a large I/O capacitor, as per the filter design requirement. The I/O coupling capacitors (plates 62 and 74 and plates 66 and 76) may be connected to the I/O pads 64 and 68 of the system ground plane 78 through via inductance. On the system ground plane 78, the I/O pads 64 and 68 and the ground plane 78 may be separated from each other.

For a wide band filter, the internal coupling between the resonators 52 and 54 should be sufficiently large to meet the design requirement. The coupling between resonators 52 and 54 can be controlled in at least two ways. One way to control the coupling may be by controlling the spacing between resonators 52 and 54, i.e., the shorter the space between resonators 52 and 54, the stronger the coupling, and the greater the space between resonators 52 and 54, the weaker the coupling. But the spacing, after a certain limit, cannot be lowered due to process limitations. Another way to control the coupling may be by using a shunt inductance, which may be implemented through a hole in layer 03 (at short end 116) and holes 56-60. The shunt inductance may control the resonator's internal coupling by providing additional inductance coupling. The inductance of the via inductor, when implemented from the short end 116 to ground through a hole in layer 03 and through holes 56-60, can be controlled by changing the via size of the hole in layer 03 (at the short end 116) and the holes 56-60. If larger inductance is needed, some physical series inductance (not shown) can be added to the via, in series. The value of inductance can be reduced by using one or more parallel vias (not shown) or increasing via diameter (not shown).

If the loading capacitors (e.g. the capacitors formed by plates 74 and 76 with ground 78) are placed above the resonator level (layer 03 in FIG. 4), they may be electrically connected to the floating ground 34A, which may be connected to the system ground by several via inductances (which may be implemented through holes 92-106, for example). Such via inductance (not shown) may be sensitive to the resonator internal coupling of resonators 52 and 54. A little via inductance variation may affect the resonator coupling, as well as the position of the upper band attenuation poles. Hence, the shunt loading capacitors (which may use plates 74 and 76) may be placed at the bottom level of the structure, as shown in FIG. 4, which may be electrically connected to the system ground plane 78.

The BPF configuration may comprise seven laminated layers, identified as layers 01-07 of FIG. 4. The dielectric sheets may be of the same dielectric material or of different dielectric materials. The via holes from short end 116 through layer 3 and through holes 56-60, as well as the via holes from the distal end 110 and from the distal end 112 through layer 03 and through holes 82-88, may be filled with conductive paste. Likewise, any of the other via holes may be filed with a conductive paste, or the like, to establish vias where they are desired.

Layer 01 may comprise a dummy dielectric sheet on top of the BPF structure. Layer 02 may provide a floating ground 34A, and layer 07 may provide a system ground 78. Layer 02 may be comparatively thick, and there may be two ground planes (on layers 02 and 07) that may be connected to each other through several vias, e.g., holes 92-106, to maintain proper grounding of the BPF structure. Via holes 92-106 represent via holes along a first edge, e.g., a front edge, of the structure shown in FIG. 4. Along a second edge, e.g., a back edge, of the structure, a similar number of via holes may provide for similar interconnecting vias. Such vias are represented in FIG. 4 by the dashed lines extending between the four corner holes in layer 02 and the four corner holes in layer 03. FIG. 4 also shows corresponding corner holes in each of layers 04, 05 and 06, permitting via interconnection of floating ground 34A to system ground 78, however, to simplify the drawing, the dashed lines are not shown between layers 03 to 07.

A similar convention is employed to show the other dashed-line via representations in FIG. 4. Specifically, each metal plate or region to which a via is coupled and extending downwardly therefrom, e.g., the resonators 52 and 54 on layer 03 and the I/O capacitor plates 62 and 66 on layer 05, is marked by one or more small circles, each such circle marker representing a location where a via is coupled and extending downwardly therefrom. The downwardly extending vias are represented by dashed lines, which (to simplify the drawings) are shown only extending down from their first level, i.e., down from their respective metal plate or region from which they first emanate. For example, three dashed-line vias are shown extending downwardly from three circular markers on the resonators 52 and 54 on layer 03. The dashed-line via near end 116 of resonators 52 and 54 is shown between layer 03 and layer 04, but is not shown beneath layer 04 (to simply the drawing), however it is understood that the via continues from layer 04 to system ground 78 on layer 07 through via holes 56-60. Similarly, the two dashed-line vias near ends 110 and 112 of resonators 52 and 54 are shown between layer 03 and layer 04, but are not shown beneath layer 04 (to simply the drawing), however it is understood that the vias continue from layer 04 to loading capacitors 74 and 76 on layer 06 through via holes 82-88. Likewise, the two-dashed line vias extending downwardly from I/O capacitor plates 62 and 66 on layer 05 are shown between layer 05 and layer 06, but are not shown beneath layer 06 (to simply the drawing), however it is understood that the vias continue from layer 06 to I/O pads 64 and 68 on layer 07 through via holes 118 and 120. A similar marking convention for the dashed-line via representations is employed on FIGS. 7-10.

A strip line resonator BPF (including a first resonator 52 and a second resonator 54) may be placed between the two ground planes. Patterns for the TEM quarter-wave resonators (hereinafter referred to as a first resonator 52 and a second resonator 54) may be placed on the dielectric sheet of layer 03. The first resonator 52 and the second resonator 54 each may have open ends 110 and 112 where the electric field may be relatively large and the magnetic field may be relatively small, and shorted ends 114 and 116 where the magnetic field may be larger and the electric field smaller. The total field is the same. The shorted ends 114 and 116 of the resonators 52 and 54 may be connected together and then terminated to the system ground 78 through the inductance (Le) of the via inductor that may be implemented through the hole in layer 03 (at short end 116) and through holes 56-60, described below with reference to layer 07.

The filter further may have a coupling between the first resonator 52 and the second resonator 54. The coupling between the first resonator 52 and the second resonator 54 may be, for example, an inductively-shunted resonator coupling. The coupling may be any structure that allows an electric field or a magnetic field, or a combination of an electric field and a magnetic field, to be generated at the first resonator 52 and to influence the second resonator 54 or to be generated at the second resonator 54 and to influence the first resonator 52. The coupling may therefore be controlled by at least one of (i) spacing between the first resonator 52 and the second resonator 54, and (ii) shunt inductance (that may be implemented through the hole in layer 03 at short end 116 and through holes 56-60) coupled to the coupling. The coupling may also be controlled by a capacitance (e.g., a direct coupling capacitance that may be formed by direct coupling capacitor plate 72 and the shorted ends 114 and 116 of the resonators 52 and 54) coupled between the first resonator 52 and the second resonator 54. If desired, a structural inductance (not shown in FIG. 4) may be placed between the first resonator 52 and the second resonator 54 to control the coupling, as described below.

Due to the coupling between the first resonator 52 and the second resonator 54, the filter of FIG. 4 may be interpreted as a pass band filter having a relatively wide bandwidth. Specifically, the filter may have a first pole and a second pole with sufficient spacing to create a predefined bandwidth, e.g., a one-gigahertz bandwidth. If desired, a very wide band BPF may be created, since additional coupling can be contributed by shunt inductance.

An electrode for a direct coupling capacitor ($C_d$) 72 may reside on layer 04. The electrode for the direct coupling capacitor ($C_d$) 72 may be regarded as a node between two series capacitances, one formed with a first input/output capacitor electrode (Ce1) 62 and another formed with a second input/output capacitor electrode (Ce2) 66.

The first input/output capacitor electrode (Ce1) 62 and the second input/output capacitor electrode (Ce2) 66 may reside on layer 05. These electrodes, and the capacitors they create, may also be known as "excitation" or "port" electrodes and capacitors, and each may create a capacitance with the electrodes on layer 06.

Direct coupling capacitor ($C_d$) may be formed between electrode 72 on layer 4 and the I/O electrodes 62 and 66 on layer 5. Control of the BPF's attenuation pole frequencies may be achieved by tuning the direct coupling capacitor ($C_d$) 72. The implementation of the direct coupling capacitor ($C_d$) 72 is also seen on the equivalent circuit depicted in FIG. 5, in which the first input/output capacitor electrode and the second input/output capacitor electrode are represented as part of the first input/output capacitor (Ce1) 62 and the second input/output capacitor (Ce2) 66.

The direct coupling capacitor ($C_d$) 72 may not interfere with the internal coupling between the first resonator 52 and the second resonator 54, since the resonator layer (layer 03) may be a thick dielectric sheet. As shown in FIG. 4, the dielectric sheet layer 03 may be thicker than the other layers. The tuning of ($C_d$) 72 may control the out-of-band attenuation pole frequencies, without affecting the internal coupling of the first resonator 52 and the second resonator 54. Accordingly, the control of the attenuation poles need not rely on the internal coupling.

A first loading capacitor electrode (C11) 74 and a second loading capacitor electrode (C12) 76 may be located on layer 06. The first loading capacitor electrode (C11) 74 and the second loading capacitor electrode (C12) 76 may form a first loading capacitance (C11) and a second loading capacitance (C12) with the system ground 78. I/O capacitor values can be tuned over a wide range when the loading capacitors C11 and C12 are sized appropriately. The first loading capacitor electrode and the second loading capacitor electrode are also shown in FIG. 5 as part of the first loading capacitor (C11) 74 and the second loading capacitor (C12) 76, respectively. The first loading capacitor electrode and the second loading capacitor electrode may be capacitively coupled to ground 78, shown as a system ground on layer 07 in FIG. 4 and as a ground in FIG. 5.

Layer 07 may be implemented on the bottom surface of the same dielectric sheet on the top surface of which the first loading capacitor electrode (C11) 74 and the second loading capacitor electrode (C12) 76 may be implemented. Layer 07 may contain the system ground 78 and the input/output pads 64 and 68. The loading capacitors 74 and 76 may reduce the physical length of the resonator 52 or 54. Since the loading capacitors 74 and 76 may reside on a separate dielectric surface, total resonator length and the loading capacitor size can be optimized to design an optimum BPF size. The I/O capacitor electrodes 62 and 66 (on layer 05) may also be connected to the I/O terminal pads 64 and 68 (on layer 07, which may be on the bottom side of the dielectric layer 06) through via inductors (that may be implemented through holes 118 and 120, as well as corresponding holes through layer 05). These via inductors are represented as Le1 and Le2 in FIG. 5.

The system ground on layer 07 may also be inductively coupled to the proximal ends 114 and 116 of the first resonator 52 and the second resonator 54 on layer 02 through a via, e.g., the hole in layer 03 at short end 116 and the holes 56-60, which may form a shunt inductance, also herein referred to as an inductively-shunted resonator coupling. This shunt inductance is represented as Le on FIG. 5.

The inclusion of an inductor to shunt the resonators may allow greater bandwidth to be filtered by the BPF. To design a low loss filter, the resonator width may be optimized in terms of the unloaded quality factor. The electromagnetic coupling between the resonators 52 and 54 can be controlled by changing the spacing between them, as well as the via inductance connecting them to system ground 78. As the resonators 52 and 54 are moved closer to each other, the coupling between them increases. Due to current processing limitations, there are limits to how closely the first resonator 52 may be spaced to the second resonator 54. To design a wideband filter, additional coupling can be added by changing the via inductance (in the hole through layer 03 at the short end 116 and in the holes 56-60). Additional coupling can be achieved by adding a physical series inductance (not shown) with the via inductance of the hole in layer 03 at short end 116 and of holes 56-60, and the total coupling can be reduced by adding parallel inductances (not shown) to the system ground 78. Thus, there may be the freedom to design a wideband filter despite current process limitations. For this type of BPF structure, the dominant coupling between resonators may be inductive, not capacitive, although capacitive coupling can be included as well.

The shunt inductance of the hole in layer 03 at the short end 116 and of the holes 56-60 may allow for greater control of the coupling between the first resonator 52 and the second resonator 54, therefore permitting greater control of the spacing between the 3-dB breakpoints of the BPF.

As shown in the FIG. 4, the first resonator 52 may have a short end 114 coupled to the shunt inductance through the hole in layer 03 at the short end 116 and the holes 56-60, and the second resonator 54 also may have a short end 116 coupled to the shunt inductance through the hole in layer 03 at the short end 116 and the holes 56-60. The inductive coupling may be implemented by a via (through the hole in layer 03 at the short end 116 and through the holes 56-60) between (i) the short end 114 of the first resonator 52 and the short end 116 of the second resonator 54 and (ii) system ground 78.

A filter in accordance with an exemplary embodiment of the present invention may include at least one of (a) a via (e.g., through the hole in layer 03 at the short end 116 and the holes 56-60) and (b) a physical inductance, e.g., an inductor. For example, a via can be used to provide a conductive path between the system ground 78 and a node that may include the short ends 114 and 116 of each resonator 52 and 54. If it is determined that additional inductance is desired, for example, when an even greater bandwidth is desired, then the inductance of the filter can be supplemented with a physical inductance (not shown). The filter may include a layer, e.g., layer 03, with both the first resonator 52 and the second resonator 54, as well as the physical inductance (not shown). Alternatively, the filter may include a first layer, e.g., layer 03, with both the first resonator 52 and the second resonator 54, and a second layer, e.g., layer 04, with the physical inductance (not shown in FIG. 4, but may be added in an unused region of layer 04 and coupled to ends 114 and 116).

If desired, the first resonator 52 may be implemented on a first layer, e.g., layer 03, the second resonator 54 may be implemented on a second layer (generally close enough to provide inductive coupling directly between the first resonator 52 and the second resonator 54), and the physical inductance (not shown) may be implemented on a third layer. The physical inductance (not shown) may comprise a metallic or otherwise conductive material, such as a conductive ceramic or conductive laminated material, or may include an active element that may conduct under predetermined conditions.

Variations on the aforementioned embodiment may also be possible without departing from the invention. For example, the $C_d$ capacitance of direct coupling capacitor 72 (in FIG. 5) may be implemented on any level, or on multiple levels in parallel, series, or in any combination thereof, since the $C_d$ capacitance 72 may have terminals that may be connected further apart than a direct coupling capacitance.

In accordance with an embodiment of the present invention, the filter may comprise a laminated dielectric filter. Laminated dielectric filters may be inexpensive to construct and extremely small. It will be appreciated, however, that other filters in accordance with embodiments of the present invention may not be laminated dielectric filters. Laminated dielectric filters may allow capacitors to be implemented with both a first plate and a second plate on a predetermined layer, or with a first plate on a first layer and a second plate on a second layer. Vias that may be perpendicular to such layers and plates can provide inductance by allowing a conductive path to extend between the layers to system ground. Also, in accordance with an embodiment of the present invention, the first resonator 52 and the second resonator 54 may each comprise transverse electric mode (TEM) resonators. If desired, however, physical inductances may be implemented on or within a layer, such as by a conductive coil.

Figure 6:
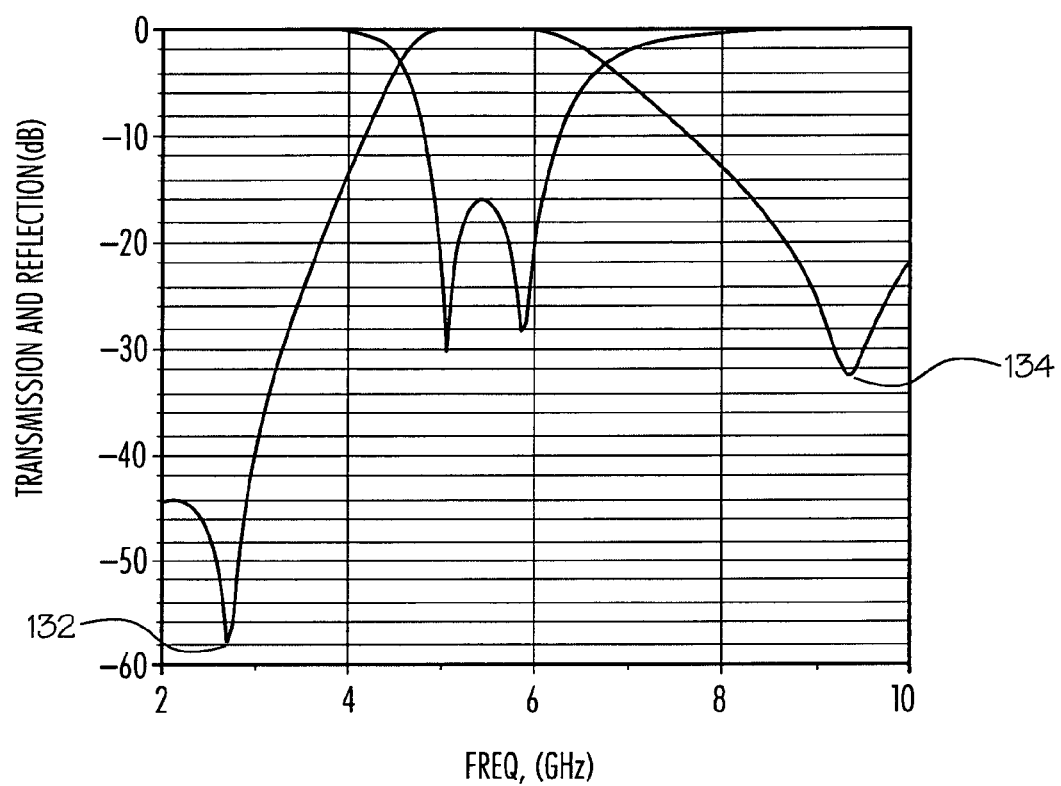
FIG. 6 is a graph showing transmission and reflection characteristics (in dB) versus frequency for a band pass filter, in accordance with the embodiment of FIG. 4 and FIG. 5.

FIG. 6 is a graph of a transmission and reflection versus frequency of the BPF, in accordance with the embodiment of FIG. 4 and FIG. 5. A first pole 132 provides attenuation of approximately 58 dB, and a second pole 134 provides attenuation in excess of 30 dB. A 30 dB suppression may facilitate separation of adjacent bands. Suppression of reflections can also be seen to be nearly 30 dB.

Figure 7:
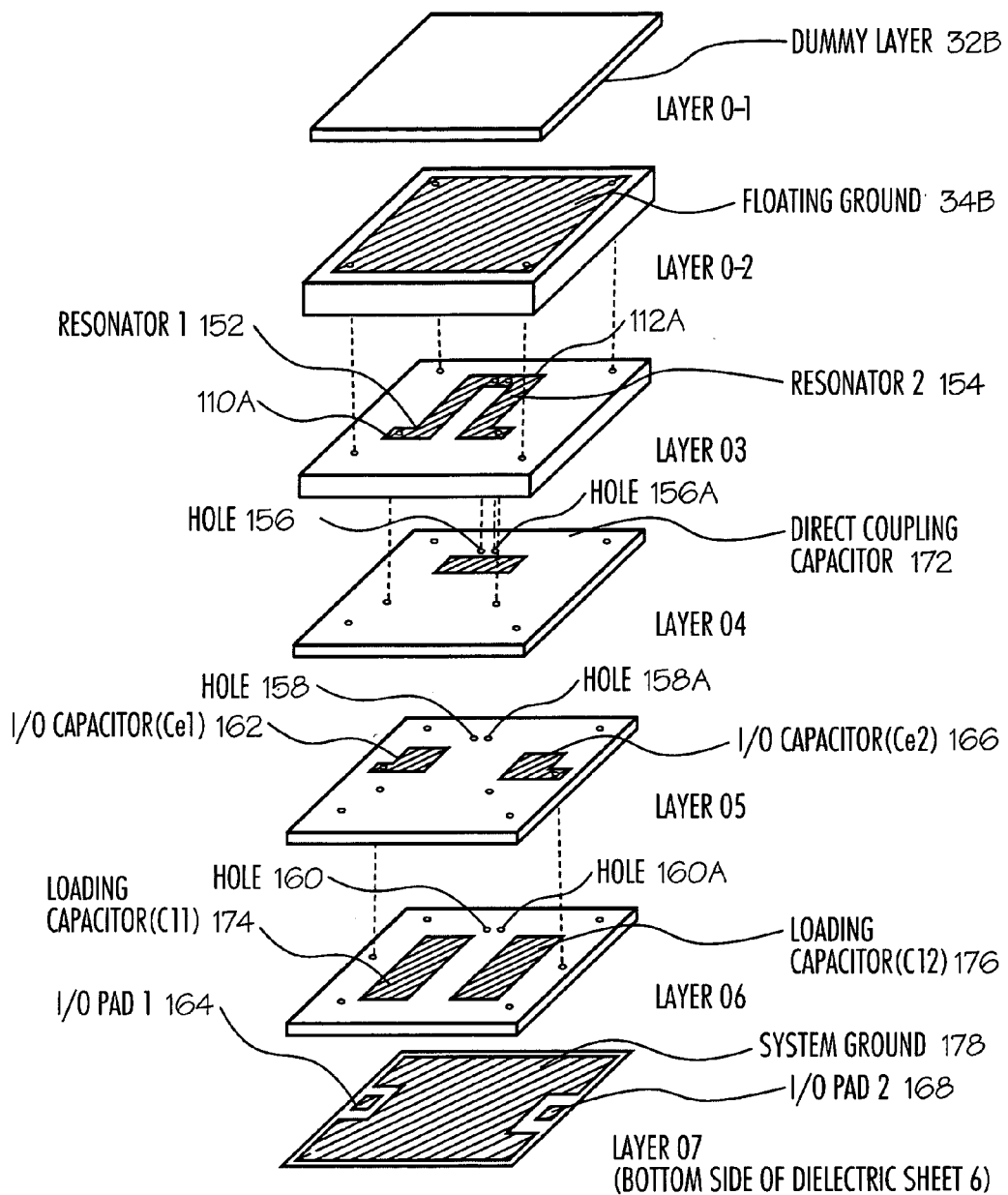
FIG. 7 is a perspective exploded view of a band pass filter configuration, in accordance with a second embodiment of the present invention.

FIG. 7 is a perspective exploded view of a BPF in accordance with a second embodiment of the present invention. The second embodiment of the present invention differs from the first embodiment in that two via-implemented through holes 156-160 and 156A-160A, rather than one, may connect the resonators 152 and 154 of layer 03 to the system ground 178 of layer 07. The via through holes 156-160 may continue to the short end (proximal end) of a first resonator 152 and the via through holes 156A-160A may continue to the short end (proximal end) of the second resonator 154. The addition of an inductor through one or more vias may allow smaller inductance to be coupled to the resonators 152 and 154, and can therefore reduce the internal coupling between the resonators 152 and 154.

The embodiment of FIG. 7, like the embodiment of FIG. 4, may be composed of multiple layers. A dummy layer 32B may be implemented on layer 01, a floating ground 34B may be implemented on layer 02, and a system ground 178 may be implemented on layer 07. A strip line resonator BPF may be placed between the two ground planes, i.e., layer 02 and layer 07. Patterns for the TEM quarter-wave resonators (hereinafter referred to as a first resonator 152 and a second resonator 154) may be placed on the dielectric sheet of layer 03. Like the resonators of FIG. 4, the first resonator 152 and the second resonator 154 of FIG. 7 each may have a distal end 110A (i.e., the open end) where the electric field may be relatively large with a smaller magnetic field and a proximal end 112A where the magnetic field may be relatively large with a smaller electric field. The proximal end 112A of the resonators may be connected together and terminated to system ground 178 through the inductance (Le) of the via inductors which may be implemented through holes in layer 03 at the proximal end 112A and through holes 156-160 and 156A-160A, described below with reference to layer 07. Those skilled in the art understand that a schematic for FIG. 7 (and FIGS. 8 and 9) would be similar to that already shown for FIG. 4, and therefore is not shown.

On layer 04, an electrode for a direct coupling capacitor ($C_d$) 172 may be deposited. On layer 05, the first input/output capacitor electrode (Ce1) 162 and the second input/output capacitor electrode (Ce2) 166 may be deposited. A first loading capacitor electrode (C11) 174 and a second loading capacitor electrode (C12) 176 may reside on layer 06. Layer 07 may be implemented on the bottom surface of the same dielectric sheet on the top surface of which the first loading capacitor electrode C11 174 and the second loading capacitor electrode (C12) 176 may be implemented. Layer 07 may contain not only the system ground 178 but also input/output pads 164 and 168. In the second embodiment of the present invention, the system ground 178 of layer 07 may be coupled through two vias implemented through via holes 156-160 and 156A-160A and through corresponding holes in layer 03 to the resonators 152 and 154 to provide additional inductance.

Figure 8:
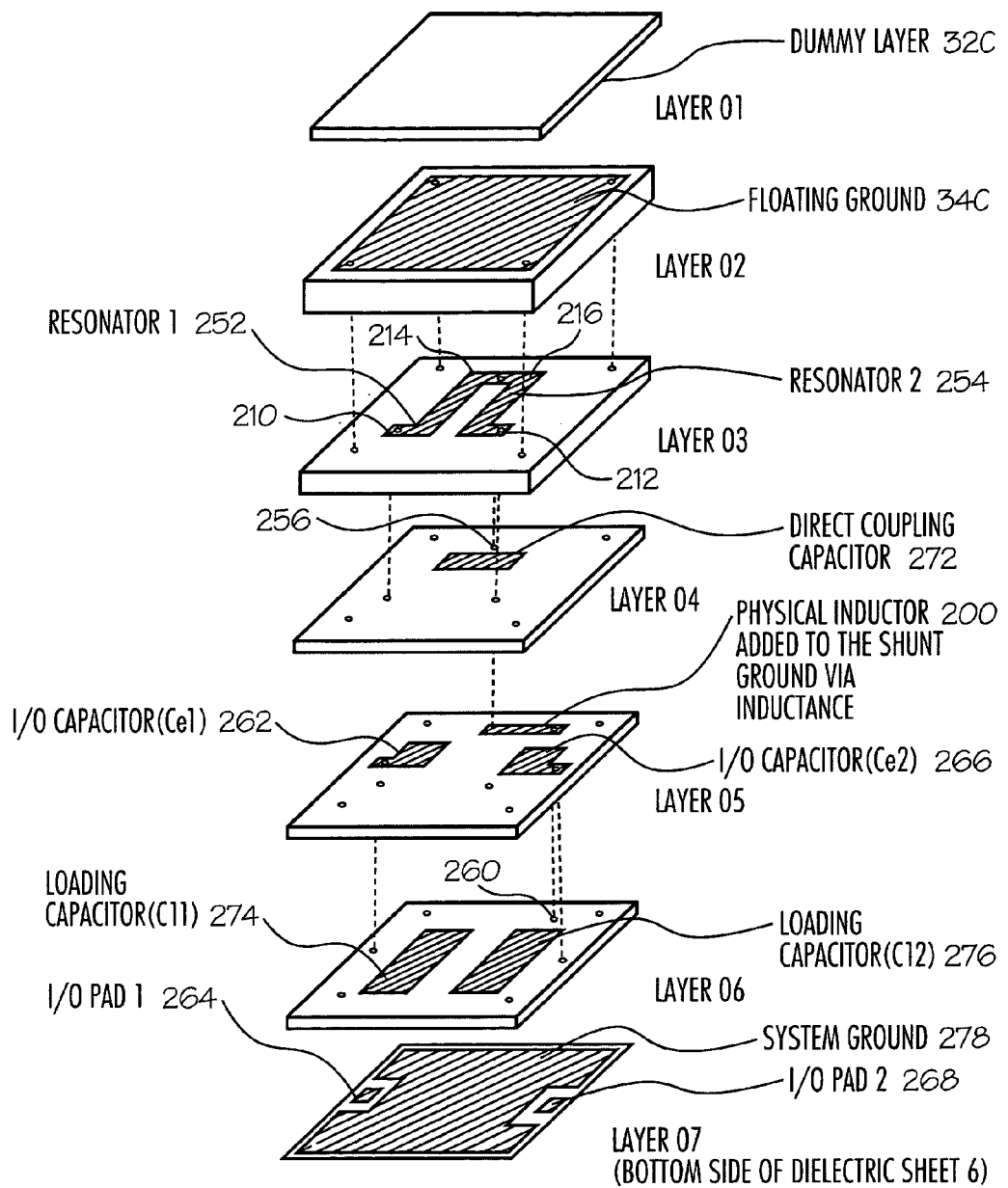
FIG. 8 is a perspective exploded view of a band pass filter configuration, in accordance with a third embodiment of the present invention.

FIG. 8 is a perspective exploded view of a BPF in accordance with a third embodiment of the present invention. The third embodiment of the present invention differs from the first embodiment in that a physical inductance 200 may be implemented on layer 05. The physical inductance 200 may allow greater inductance to be coupled to the resonators 252 and 254, and can therefore increase the internal coupling between the resonators 252 and 254.

The embodiment of FIG. 8, like the embodiments of FIG. 4 and FIG. 7, may comprise multiple layers. A dummy layer 32C may be implemented on layer 01, a floating ground 34C may be implemented on layer 02, and a system ground 278 may be implemented on layer 07. A strip line resonator BPF may be placed between the two ground planes, i.e., layer 02 and layer 07. Patterns for the TEM quarter-wave resonators (hereinafter referred to as a first resonator 252 and a second resonator 254) may reside on the dielectric sheet of layer 03. Like the resonators of FIG. 4, the first resonator 252 and the second resonator 254 of FIG. 8 may have distal ends 210 and 212, respectively, where the electric field may be relatively large with a smaller magnetic field and proximal ends 214 and 216, respectively, where the magnetic field may be relatively large with a smaller electric field. The proximal ends 214 and 216 of the resonators 252 and 254 may be connected and terminated through the physical inductance 200 to the system ground 278 through the inductance (Le) of the via inductor, which may be implemented through a hole in layer 03, hole 256, physical inductor 200 as well as a hole in layer 05, and hole 260, described below.

On layer 04, an electrode for a direct coupling capacitor ($C_d$) 272 may be deposited. On layer 05, the first input/output capacitor electrode (Ce1) 262 and the second input/output capacitor electrode (Ce2) 266 may be deposited. A first loading capacitor electrode (C11) 274 and a second loading capacitor electrode (C12) 276 may be located on layer 06. Layer 07 may be implemented on the bottom surface of the same dielectric sheet on the top surface of which the first loading capacitor electrode (C11) 274 and the second loading capacitor electrode (C12) 276 may be implemented. Layer 07 may contain not only the system ground 278 but also input/output pads 264 and 268. In the third embodiment of the present invention, the system ground 278 of layer 07 may be coupled through a physical inductance 200 on layer 05 to increase total shunt inductance and thereby increase the total internal coupling between the resonators 252 and 254.

Figure 9:
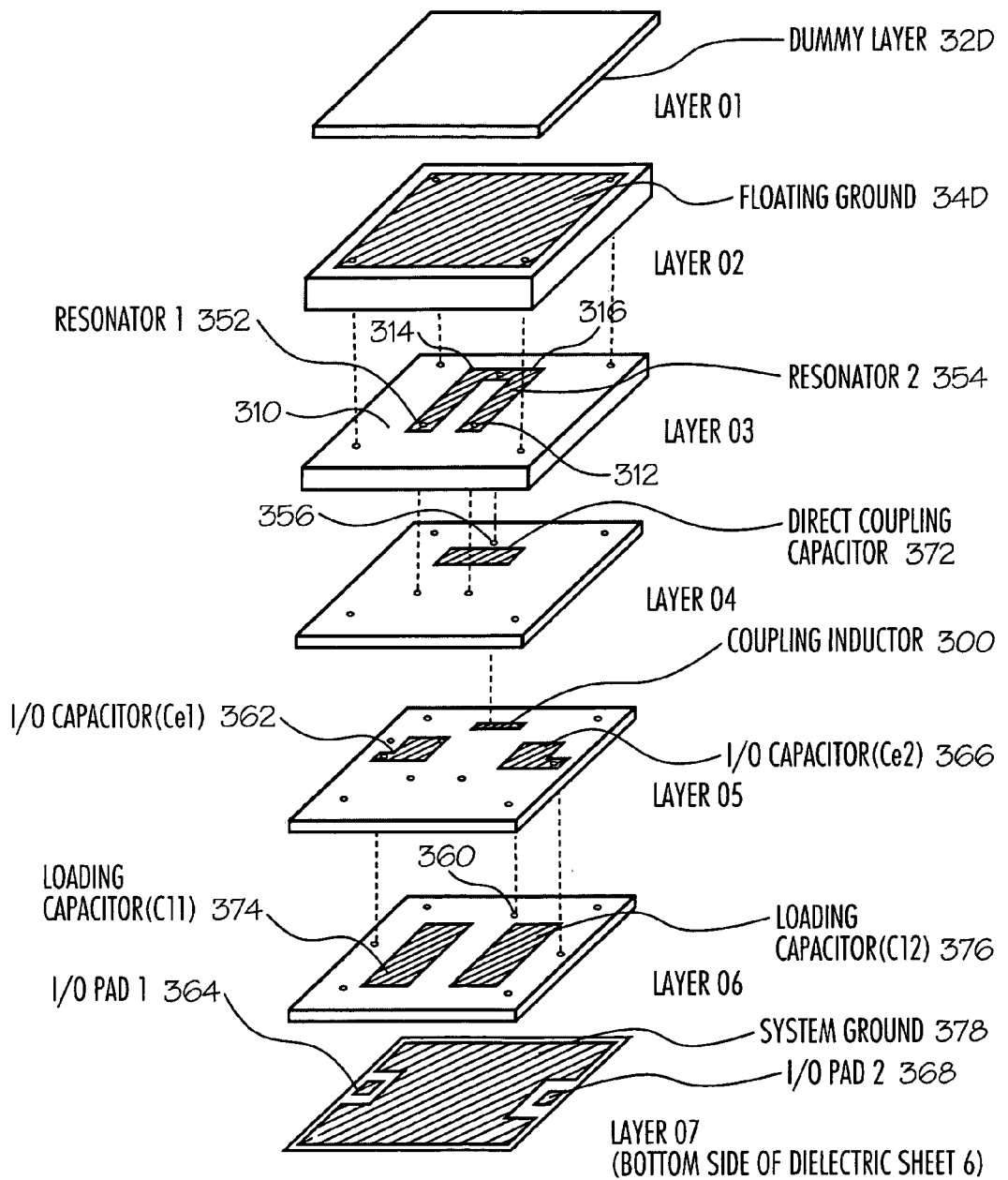
FIG. 9 is perspective exploded view of a band pass filter configuration, in accordance with a fourth embodiment of the present invention.

FIG. 9 is a perspective exploded view of a BPF in accordance with a fourth embodiment of the present invention. The fourth embodiment of the present invention differs from the third embodiment in that not only may a physical inductance 300 be implemented on layer 05 (as in the embodiment of FIG. 8), but the resonators 352 and 354 may be straightened, as well. The straightened resonators 352 and 354 may allow greater internal coupling between the resonators 352 and 354.

The embodiment of FIG. 9, like the embodiments of FIG. 4, FIG. 7 and FIG. 8 may comprise multiple layers. A dummy layer 32D may be implemented on layer 01, a floating ground 34D may be implemented on layer 02, and a system ground 378 may be implemented on layer 07. A strip line resonator BPF may reside between the two ground planes, i.e., layer 02 and layer 07. Patterns for the TEM quarter-wave resonators (hereinafter referred to as a first resonator 352 and a second resonator 354) may reside on the dielectric sheet of layer 03. Like the resonators of FIG. 4, the first resonator 352 and the second resonator 354 of FIG. 9 may have distal ends 310 and 312, respectively, where the electric field may be relatively large with a smaller magnetic field, and proximal ends 314 and 316, respectively, where the magnetic field may be relatively large with a smaller electric field. The proximal ends 314 and 316 of the resonators 352 and 354, respectively, may be connected together and terminated to the system ground 378 through the inductance (Le) of a via inductor, which may be implemented through a hole in layer 03, hole 356, coupling inductor 300, a hole in layer 05 and hole 360.

On layer 04, an electrode for a direct coupling capacitor ($C_d$) 372 may be deposited. On layer 05, the first input/output capacitor electrode (Ce1) 362 and the second input/output capacitor electrode (Ce2) 366 may be deposited. A first loading capacitor electrode (C11) 374 and a second loading capacitor electrode (C12) 376 may reside on layer 06. Layer 07 may be implemented on the bottom surface of the same dielectric sheet on the top surface of which the first loading capacitor electrode (C11) 374 and the second loading capacitor electrode (C12) 376 may be implemented. Layer 07 may contain not only the system ground 378, but also input/output pads 364 and 368. In the fourth embodiment of the present invention, the system ground 378 of layer 07 may be coupled through a physical inductance 300 on layer 05 to provide additional inductance to increase the total internal coupling between the resonators 352 and 354.

Figure 10:
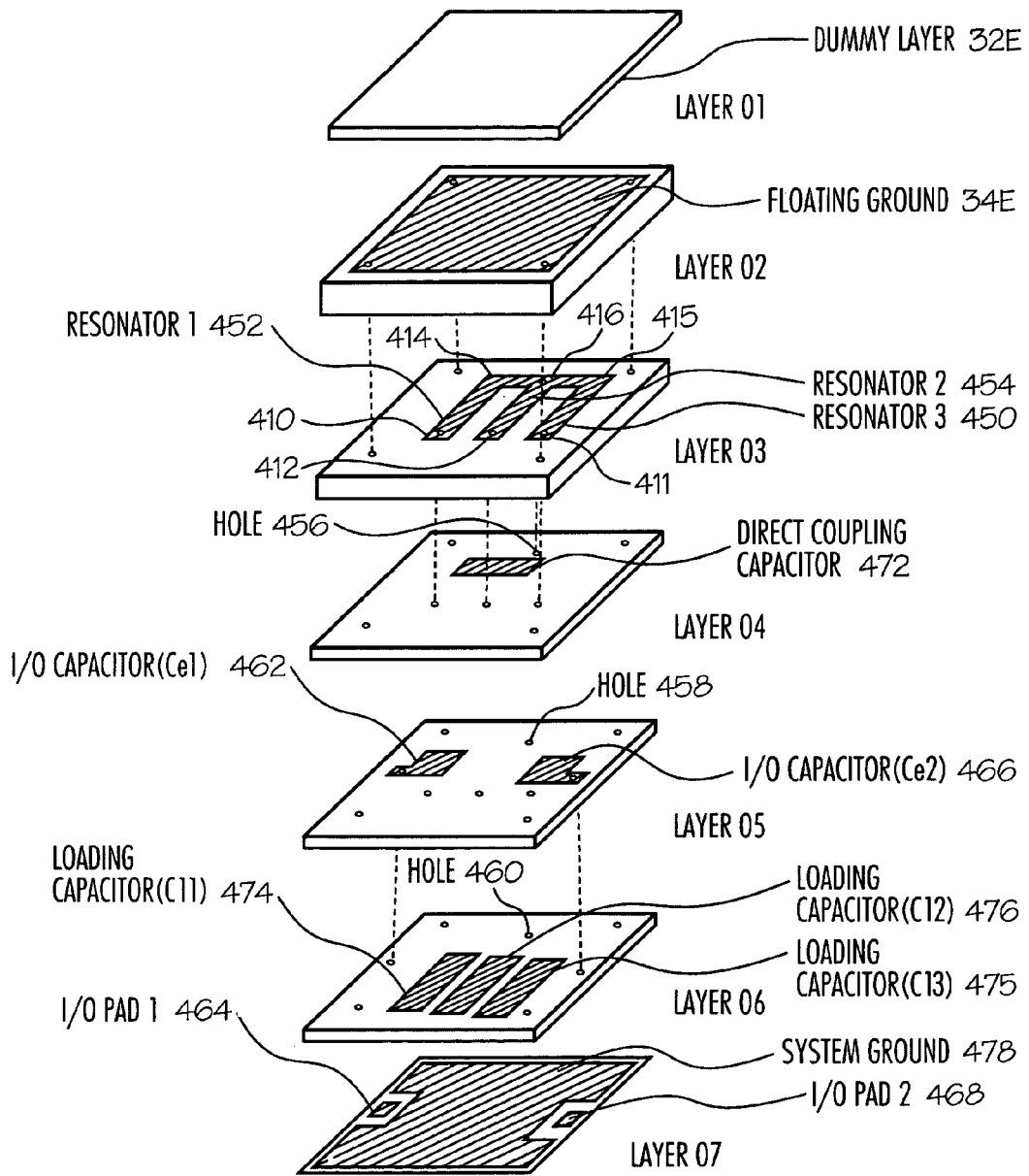
FIG. 10 is perspective exploded view of a band pass filter configuration, in accordance with a fifth embodiment of the present invention.
Figure 11:
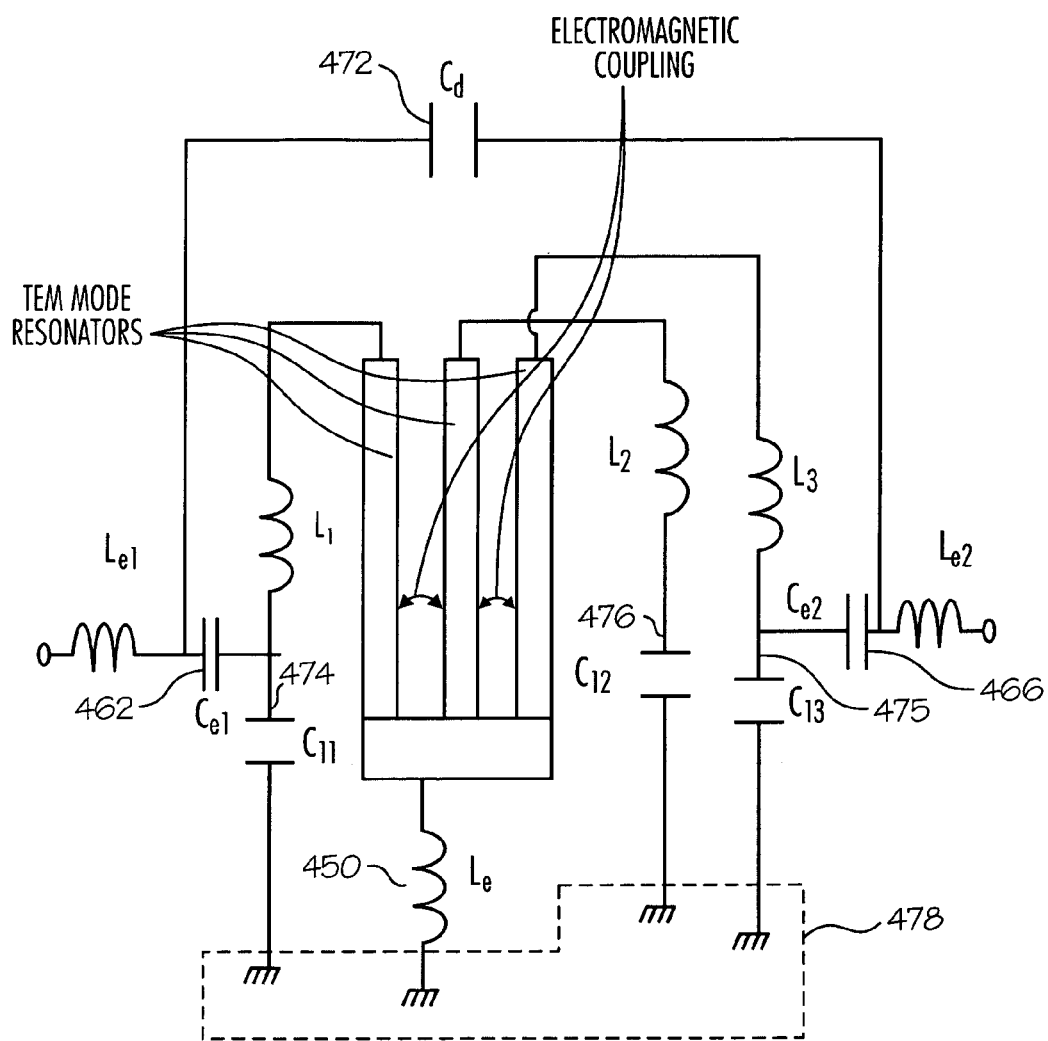
FIG. 11 is an equivalent circuit for the band pass filter configuration of FIG. 10.

FIG. 10 is a perspective exploded view of a BPF in accordance with a fifth embodiment of the present invention. FIG. 11 is an electrical schematic of an equivalent circuit for the embodiment of FIG. 10. The fifth embodiment of the present invention differs from the fourth embodiment in that an additional resonator 450 may be added. The BPF may include three (or more) resonator stages. The resonators 450-454 may be three quarter-wave TEM-mode resonators. The shortened ends 414-416 of the resonators 450-454 may be connected together and then grounded through the inductance of a via inductor, which may be implemented through holes 456-460 and through a hole in layer 03 to the proximal end 416. Each resonator 450-454 may be straightened to increase coupling among the resonators 450-454. Also, three loading capacitors electrodes 474-476 may be located on layer 06.

The embodiment of FIG. 10, like the embodiments of FIG. 4, FIG. 7, FIG. 8 and FIG. 9, may comprise multiple layers. A dummy layer 32E may be implemented on layer 01, a floating ground 34E may be implemented on layer 02, and a system ground 478 may be implemented on layer 07. A strip line resonator BPF may be placed between the two ground planes, i.e., layer 02 and layer 07, although the strip line resonator BPF of FIG. 10 may include three (or more) resonators 450-454, rather than two, and the resonators 450-454 may be straightened. Patterns for the TEM quarter-wave resonators (hereinafter referred to as a first resonator 452, a second resonator 454 and a third resonator 450) may reside on the dielectric sheet of the layer 03. Like the resonators of FIG. 4, the first resonator 452, the second resonator 454 and the third resonator 450 of FIG. 10 may have distal ends 410-412 where the electric field may be relatively large with a smaller magnetic field and proximal ends 414-416 where the magnetic field may be relatively large with a smaller electric field. The proximal ends 414-416 of the resonators 450-454 may be connected together and terminated to the system ground 478 through the inductance 450 (Le) of the via inductor implemented through the hole in layer 03 and through holes 456-460, described below.

On layer 04, an electrode for a direct coupling capacitor ($C_d$) 472 may be deposited. On layer 05, the first input/output capacitor electrode (Ce1) 462 and the second input/output capacitor electrode (Ce2) 466 may be deposited. A first loading capacitor electrode (C11) 474, a second loading capacitor electrode (C12) 476 and a third loading capacitor electrode (C13) 475 may be located on layer 06. Layer 07 may be implemented on the bottom surface of the same dielectric sheet on the top surface of which the first loading capacitor electrode (C11) 474, the second loading capacitor electrode (C12) 476, and the third loading capacitor electrode (C13) 475 may be implemented. Layer 07 may contain not only the system ground 478, but also input/output pads 464 and 468. In the fifth embodiment of the present invention, the system ground 478 of layer 07 may be coupled through a via inductance, which may extend through the hole in layer 03 and through corresponding holes 456-460 to increase the total internal coupling between the resonators 450-454. The additional resonator 450 may be in parallel with the second resonator 454. It should be appreciated that additional resonators may also be added, with coupling that can be used to refine the shape of the filter's electrical performance.

Referring to FIG. 11, the first loading capacitor electrode, the second loading capacitor electrode and the third loading capacitor electrode may each be capacitively coupled to ground 478, forming shunt loading capacitors (C11) 474, (C12) 476, and (C13) 475. As in the aforementioned embodiments, there may be two I/O capacitor terminals 462 and 466 on layer 05, each of which may be inductively coupled to an I/O pad 464 and 468 on layer 07.

As in the aforementioned embodiments, the system ground 478 on layer 07 may be inductively coupled to the proximal end of the first resonator 452, the second resonator 454 and the third resonator 450 on layer 03 through a via, which may extend through a hole in layer 03 and the holes 456-460, forming a shunt inductance, also referred to herein as an inductively-shunted resonator coupling. The shunt inductance is shown as Le 450 in FIG. 11.

In the aforementioned embodiments, the inclusion of an inductor to shunt the resonator may allow greater control over the internal coupling and allow a greater bandwidth to be filtered by the BPF. To design a low loss filter, the resonator width may be optimized in terms of the unloaded quality factor. Electromagnetic coupling between the resonators can be controlled by changing the spacing between them, as well as the via inductance connecting them to the system ground. As the resonators move closer to each other, the coupling between them increases. Due to current process limitations, a certain minimum separation may be established between resonators. But to design a wideband filter, additional coupling can be added by changing the via inductance value. Additional coupling can be achieved by adding a physical series inductance with the via inductance, and the total coupling can be reduced by adding parallel inductances to the system ground. Thus, the freedom to design a wideband filter, with current or future process limitations may be achieved. For this type of BPF structure, the dominant coupling between resonators may become inductive, not capacitive, although capacitive coupling can be included as well.

The shunt inductance may allow for greater control of the coupling between the resonators, therefore allowing greater control of the spacing between the 3-dB breakpoints of the BPF.

Figure 12:
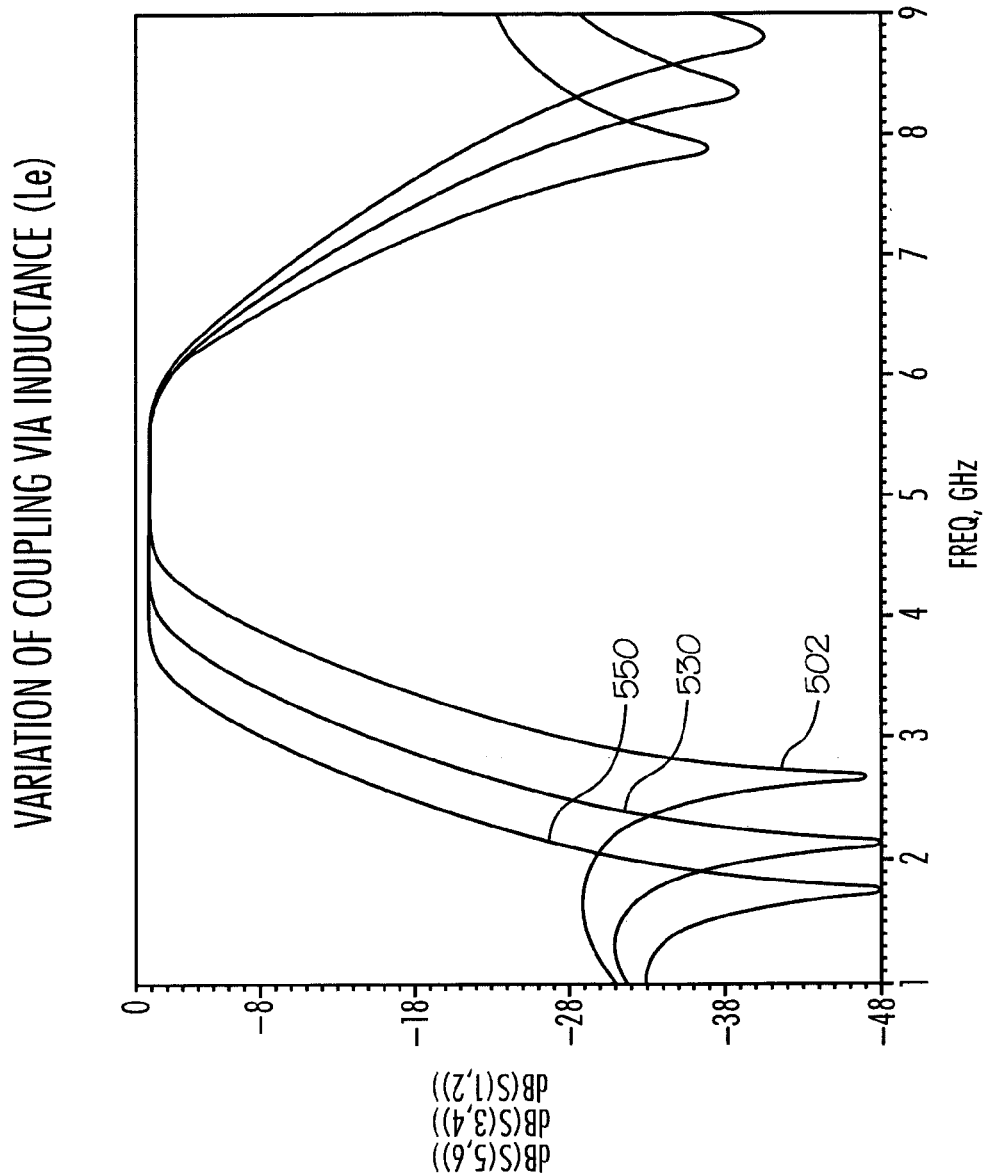
FIG. 12 is a graph showing the impact of varying the shunt inductance in a band pass filter, in accordance with the first embodiment of the present invention.

FIG. 12 is a graph showing changing relationships due to variations of the internal coupling, i.e., the 3-dB bandwidth varies with the varied shunt inductance, in accordance with the first described embodiment of the present invention. A first trace 502 of the graph of FIG. 12, labeled S(1,2), shows a transmission loss of the BPF for a shunt inductance of 0.2 nH. By increasing shunt inductance, the bandwidth of the filter can be increased.

A second trace 530 of the graph of FIG. 12, labeled S(3,4), shows a transmission loss of the BPF for a shunt inductance of 0.3 nH. By increasing the shunt inductance from 0.2 nH to 0.3 nH, the bandwidth of the filter can be increased.

A third trace 550 of the graph of FIG. 12, labeled S(5,6), shows a transmission loss of the BPF for a shunt inductance of 0.4 nH. As the shunt inductance is increased from 0.2 nH to 0.3 nH and then to 0.4 nH, the bandwidth of the filter can be further increased.

Figure 13:
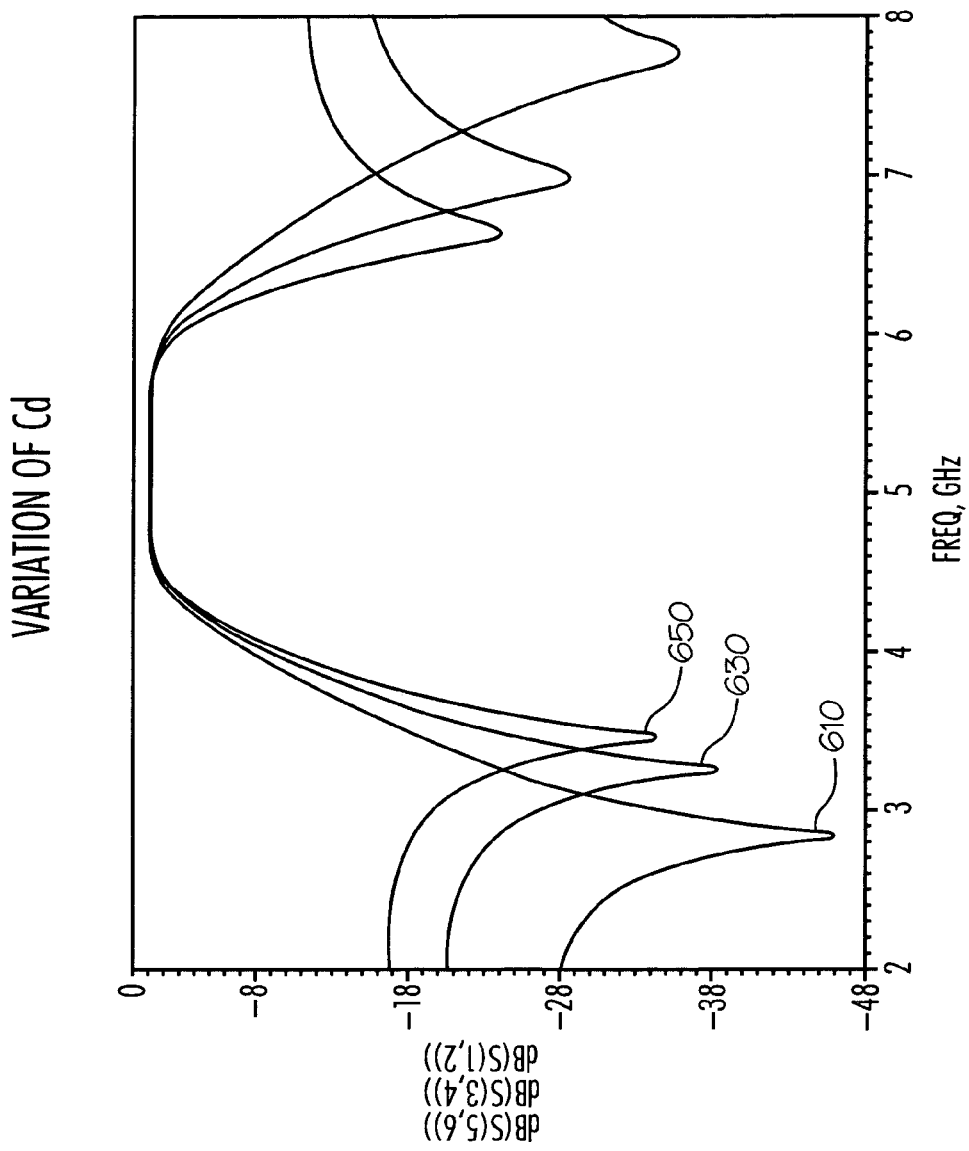
FIG. 13 is a graph showing the impact of varying the direct coupling capacitance ($C_d$) in a band pass filter, in accordance with the first embodiment of the present invention.

FIG. 13 is a graph showing changing relationships due to variation of the direct coupling capacitance ($C_d$), in accordance with the first described embodiment of the present invention. A first trace 610 of the graph of FIG. 13, labeled S(1,2), shows a transmission loss of the BPF for a direct coupling capacitance of 0.1 pF. The transmission loss, which describes a loss within the transmitter, may have approximately 28 dB of suppression for signals of 2.0 GHz, and the transmission loss may have an attenuation pole (about 46 dB of suppression) at a frequency of about 2.85 GHz. The transmission signal may have very little suppression within the pass band, specifically between about 4.25 GHz and 6.15 GHz. Thus, there may be very strong suppression outside a wide band, and very little suppression within the band, producing a very effective BPF.

A second trace 630 of the graph of FIG. 13, labeled S(3,4), shows a transmission loss of the BPF for a direct coupling capacitance of 0.15 pF. The transmission loss does not have as much suppression outside the pass band.

A third trace 650 of the graph of FIG. 13, labeled S(5,6), shows a transmission loss of the BPF for a direct coupling capacitance of 0.2 pF. The transmission loss has even less suppression outside the pass band, as compared to the characteristics for traces 610 and 630.

FIG. 13 therefore shows that the attenuation poles and other characteristics of the BPF may be controlled by changing the direct coupling capacitance.

Thus, a low-profile multilayer dielectric BPF having a high unloaded quality factor for a Wireless-LAN (Local Area Network) and/or other communication systems has been shown. The low-profile multilayer dielectric BPF may have several layers of thin dielectric sheets and electrode layers that may be co-fired together to form a single body. It should be appreciated that the foregoing is only one example of an inductively-shunted resonator coupling, and that other embodiments and designs are possible without departing from the spirit of the invention. For example, additional resonators may be added, or additional passive elements, such as additional capacitors or inductors, may be added, to further shape the pass band. Moreover, multiple BPFs may be implemented within a common monolithic structure. Other types of filters, such as low pass filters, stop band filters, and high pass filters, as well as filters having multiple bands, may also be implemented within the scope of the invention.

What is claimed is:

1. A filter comprising:
   (a) a first resonator formed on a first dielectric layer;
   (b) a second resonator formed on the first dielectric layer, wherein a first end of the first resonator is connected to a first end of the second resonator, and wherein an electromagnetic coupling is formed by an electromagnetic field generated by the first resonator and an electromagnetic field generated by the second resonator;
   (c) a direct coupling capacitor formed by a first plate on a second dielectric layer and a second plate on a third dielectric layer; and
   (d) a via inductor coupled to the first end of the first resonator and the first end of the second resonator, wherein the via inductor extends through the first, second, and third dielectric layers, wherein the electromagnetic coupling is controlled by at least one of:
      (i) a spacing between the first resonator and the second resonator; and
      (ii) the via inductor.

2. The filter of claim 1, further comprising a system ground plate formed on a fourth dielectric layer.

3. The filter of claim 2, wherein the first and second resonators are coupled to the system ground plate through the via inductor.

4. The filter of claim 2, further comprising a plurality of shunt loading capacitors formed by a plurality of plates on the fifth dielectric layer and the system ground plate.

5. The filter of claim 2, further comprising a floating ground plate formed on a sixth dielectric layer and connected to the system ground plate.

6. The filter of claim 2, further comprising a shunt loading capacitor formed by a plate on a fifth dielectric layer and the system ground plate.

7. The filter of claim 6, wherein the via inductor extends through the fifth dielectric layer.

8. The filter of claim 1, further comprising a plurality of via inductors coupled to the first end of the first resonator and the first end of the second resonator, wherein the via inductors extend through the first, second, and third dielectric layers.

9. The filter of claim 1, further comprising a plurality of direct coupling capacitors formed by a plurality of plates on the second dielectric layer and a plurality of plates on the third dielectric layer.

10. The filter of claim 1, further comprising a third resonator formed on the first dielectric layer, wherein a first end of each of the first, second, and third resonators are connected together, and wherein the via inductor is coupled to the first end of each of the first, second, and third resonators.

* * * * *